United States Patent [19]

Ohira et al.

[11] Patent Number: 4,905,201
[45] Date of Patent: Feb. 27, 1990

[54] SEMICONDUCTOR MEMORY DEVICE CAPABLE OF SELECTIVE OPERATION OF MEMORY CELL BLOCKS

[75] Inventors: Tsuyoshi Ohira; Tomio Nakano, both of Kawasaki, Japan

[73] Assignee: Fujitsu Limited, Kawasaki, Japan

[21] Appl. No.: 59,063

[22] Filed: Jun. 5, 1987

[30] Foreign Application Priority Data

Jun. 6, 1986 [JP] Japan ................................. 61-131443

[51] Int. Cl.[4] .......................... G11C 7/00; G11C 11/40
[52] U.S. Cl. ........................... 365/230.03; 365/230.08; 365/189.08; 365/233
[58] Field of Search .......... 365/230, 233, 189, 230.03, 365/230.06, 189.08, 230.08

[56] References Cited

U.S. PATENT DOCUMENTS 3,855,580 12/1974 Lighthall et al. ................... 365/233
3,931,616 1/1975 Klos .................................. 365/233 X
3,935,565 1/1976 Moore, III .......................... 365/233
4,532,612 7/1985 Tanaka et al. ...................... 365/227
4,701,843 10/1987 Cohen ............................... 365/222 X Primary Examiner—Stuart N. Hecker
Assistant Examiner—Alyssa H. Bowler
Attorney, Agent, or Firm—Staas & Halsey

[57] ABSTRACT

A semiconductor memory device having a memory cell array constituted by a plurality of memory cell blocks includes a clock generator unit constituted by a plurality of clock generator sections, each of the clock generator sections corresponding to each of the memory cell blocks, and a block selector unit for selecting one of the clock generator sections in correspondence with the row address of a designated address. Accordingly, only a clock generator section corresponding to the selected memory cell block is operated by the designated address.

5 Claims, 11 Drawing Sheets

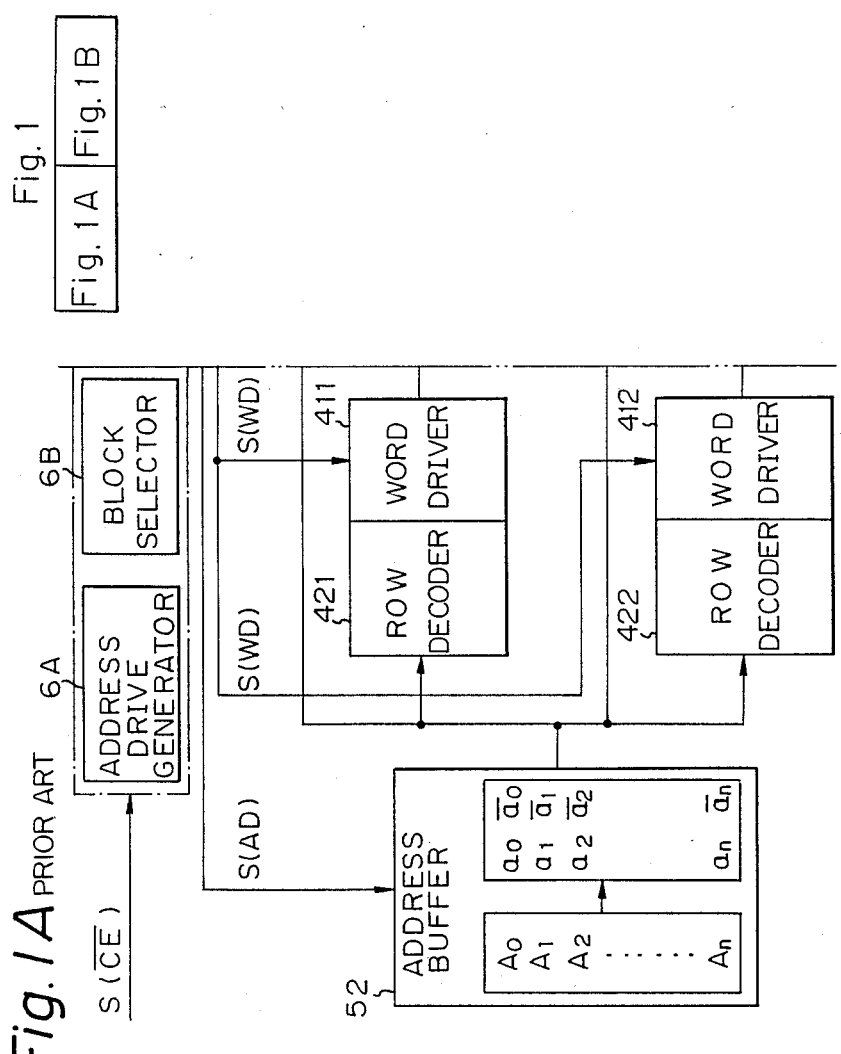

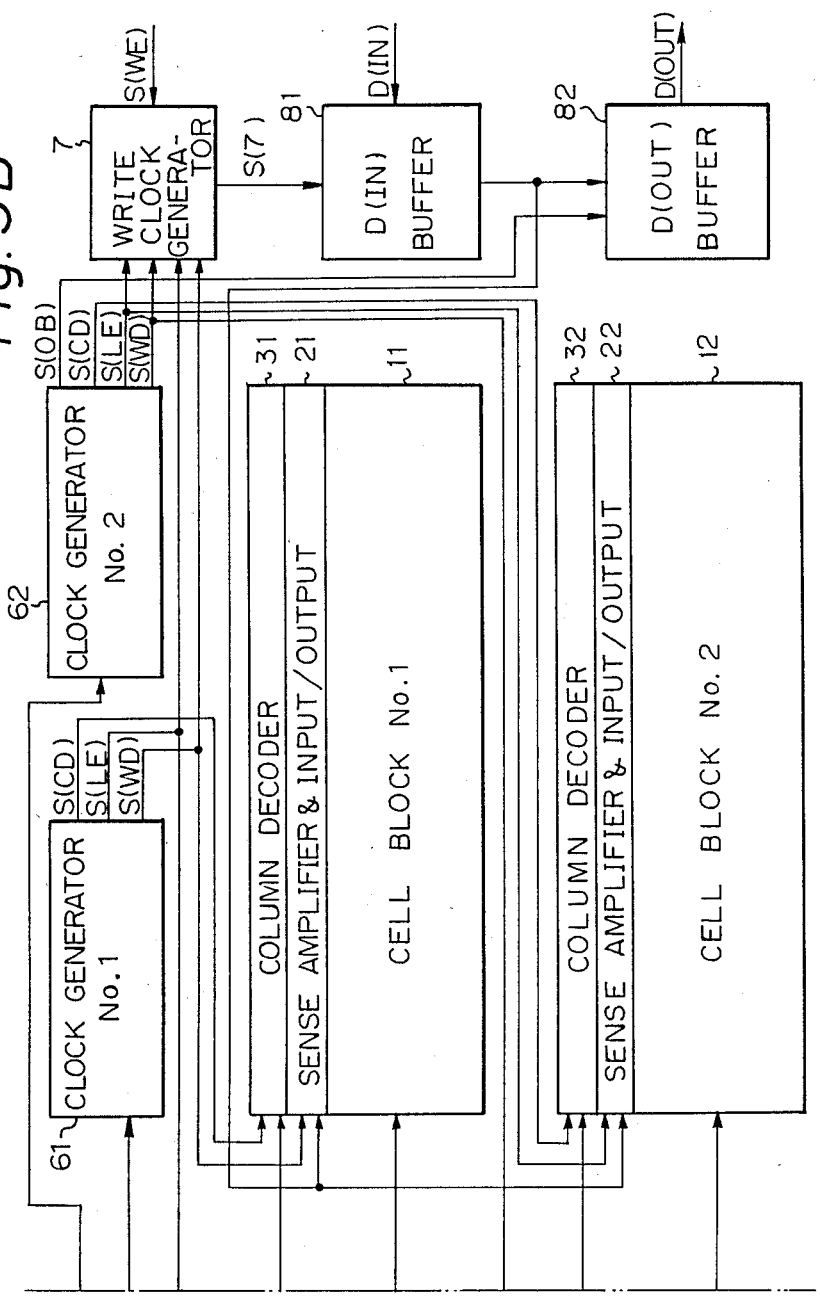

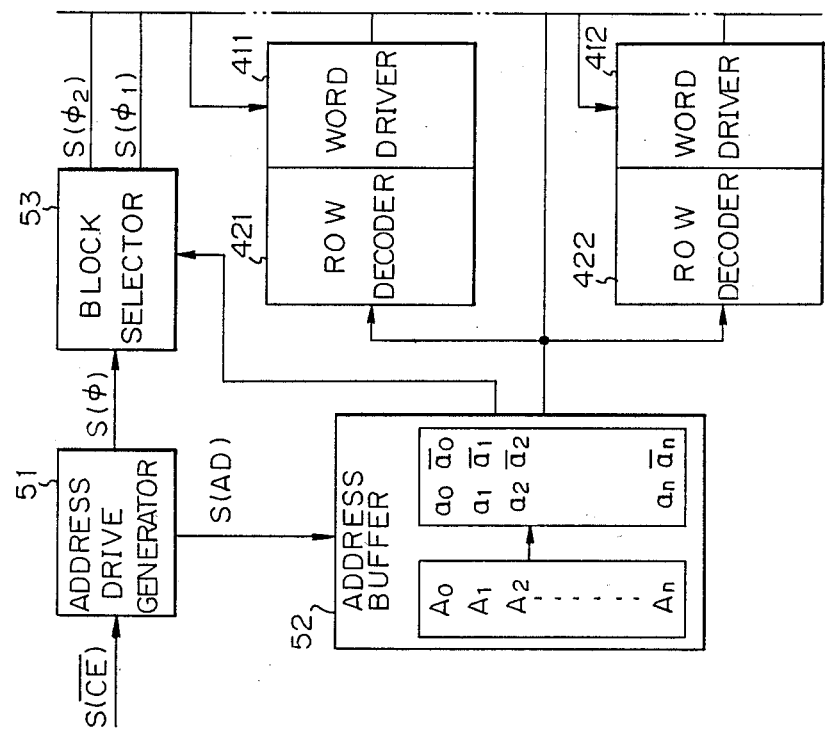

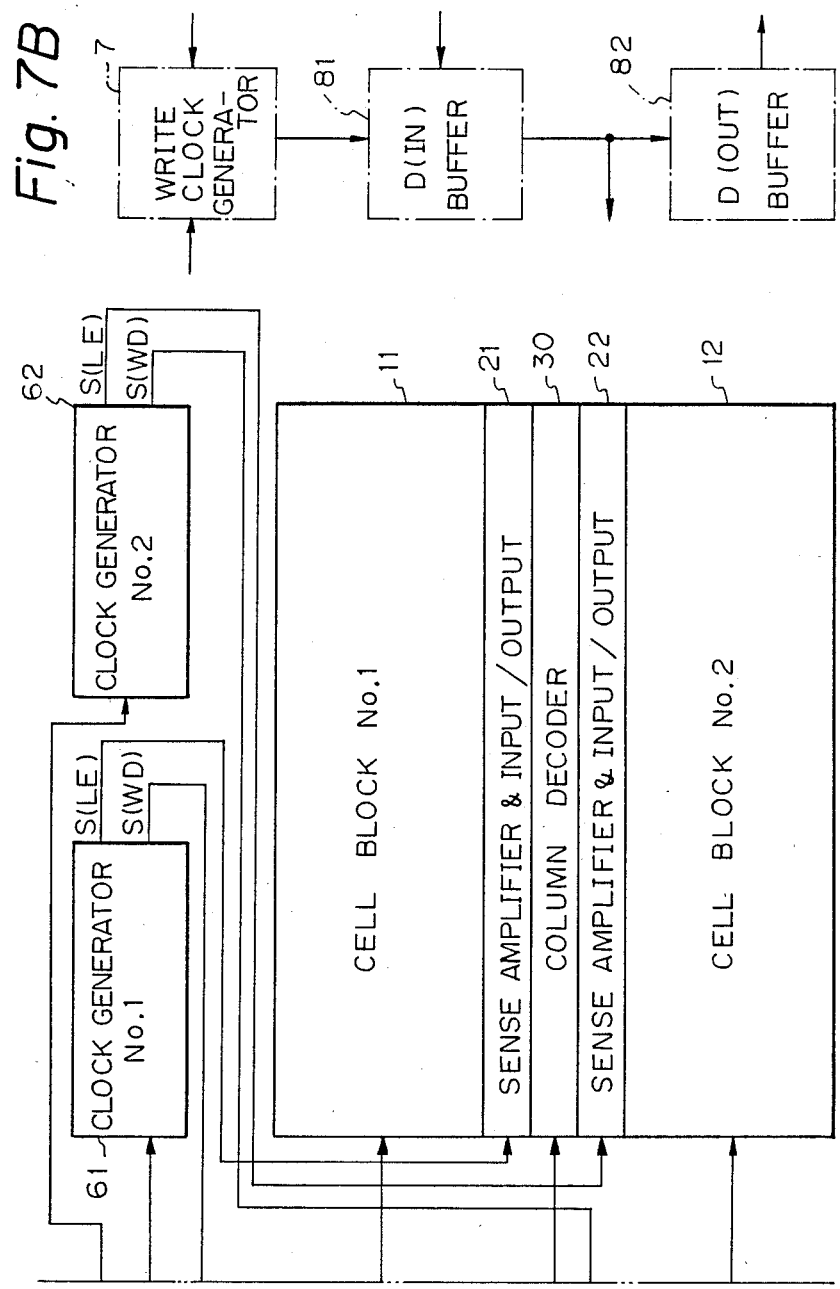

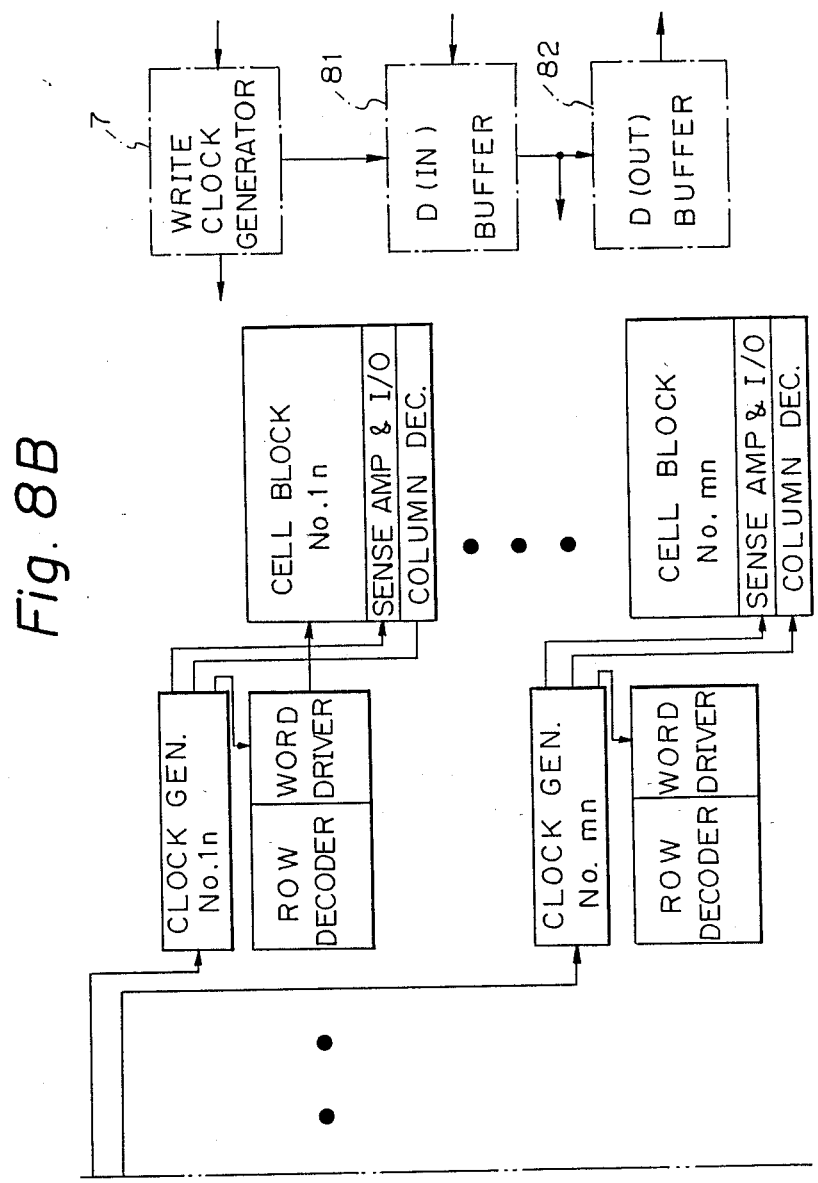

SEMICONDUCTOR MEMORY DEVICE CAPABLE OF SELECTIVE OPERATION OF MEMORY CELL BLOCKS

BACKGROUND OF THE INVENTION

1. Field of the Invention

The present invention relates to a semiconductor memory device in which the selective operation of a memory cell block selected from a plurality of memory cell blocks can be carried out. The device according to the present invention is applicable to, for example, a dynamic random access memory.

2. Description of the Related Arts

In the prior art semiconductor memory device, a memory cell array is sometimes constituted by a plurality of memory cell blocks.

In such device, it is possible to keep the memory cell blocks which do not include the selected word line in the inactive state so that the consumption of electric power of the device is reduced.

However, in the above-described prior art device, only some of the memory cell blocks are kept in the inactive state due to a non-selection thereof, and the clock generator which is provided in common for the plurality of memory cell blocks is always in operation to supply clock signals such as word line activation clock signal to all of the plurality of memory cell blocks. Hence, the reduction of the electric power consumption is not satisfactorily attained in such a prior art device.

Particularly, in a large capacity semiconductor memory device having a chip size of the order of 10 mm² or more, the length of the wiring for transmitting clock signals becomes large, and accordingly, the parasitic capacitance of the wiring becomes large, so that a high speed operation of the device is difficult to attain. Also, the consumption of electric power becomes large, and an IR drop caused by the resistance of the wiring becomes significant.

SUMMARY OF THE INVENTION

It is an object of the present invention to provide an improved semiconductor memory device in which the capacitance of the wirings is reduced so that the charge/discharge current of the wirings is reduced, the CR value of the wirings is reduced so that the operation speed of the device is enhanced, and only one clock generator and the corresponding memory cell block is required to be operated, so that the consumption of electric power is reduced.

According to the present invention, there is provided a semiconductor memory device including a memory cell array constituted by a plurality of memory cell blocks, each of the memory cell blocks being operatively connected with a row decoder and a column decoder; a clock generator unit constituted by a plurality of clock generator sections, each of the clock generator sections corresponding to each of the memory cell blocks; and a block selector unit for selecting one of the clock generator sections in correspondence with the row address of a designated address. Accordingly, only a clock generator section corresponding to the selected memory cell block is operated by the designated address.

BRIEF DESCRIPTION OF THE DRAWINGS

In the drawings,

FIGS. 7a and b show a modified embodiment of the present invention; and

DESCRIPTION OF THE PREFERRED EMBODIMENTS

Before describing a typical embodiment of the present invention, a prior art semiconductor memory device is explained with reference to FIGS. 1 and 2. The structure of the clock generator in the device of FIG. 1 is shown in FIG. 2.

Figure 1B:
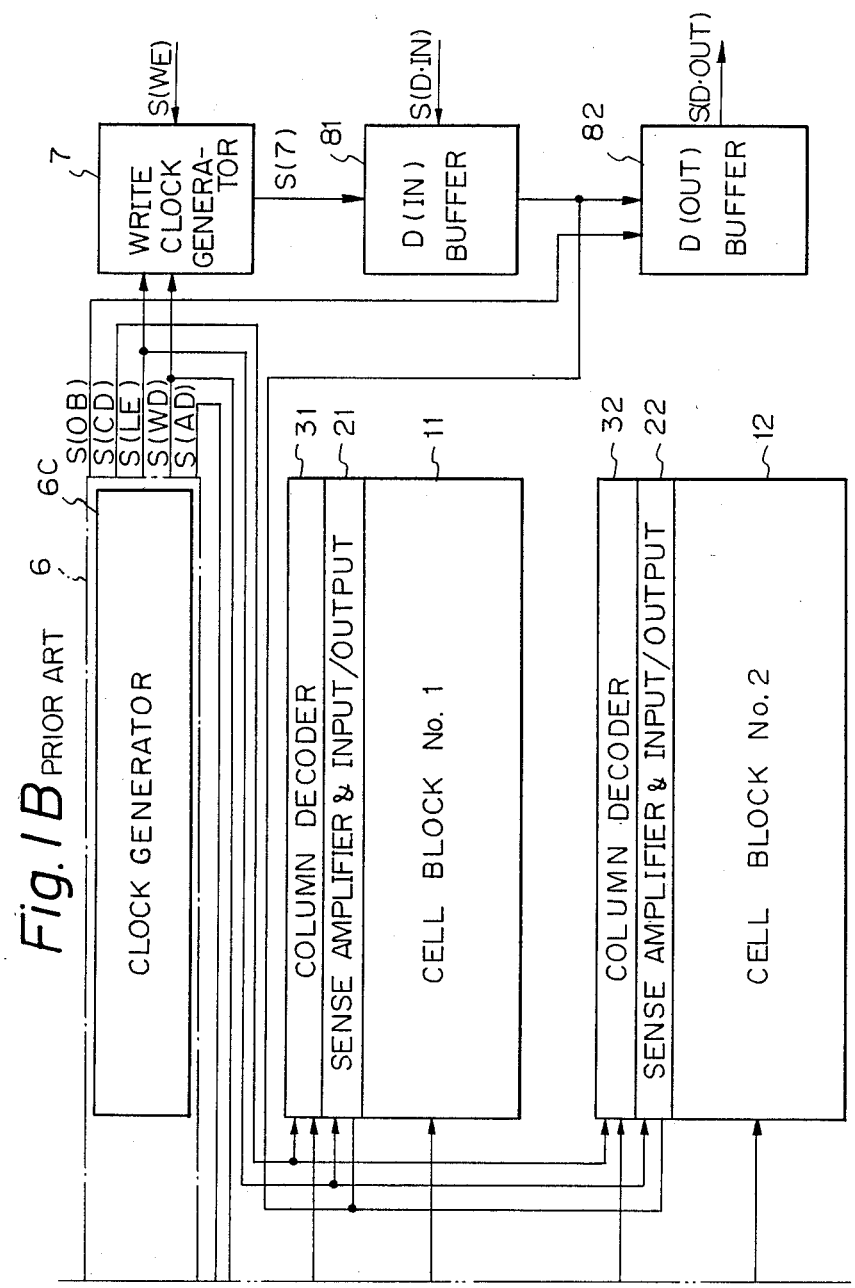
FIGS. 1a and b show a prior art semiconductor memory device.
Figure 2:
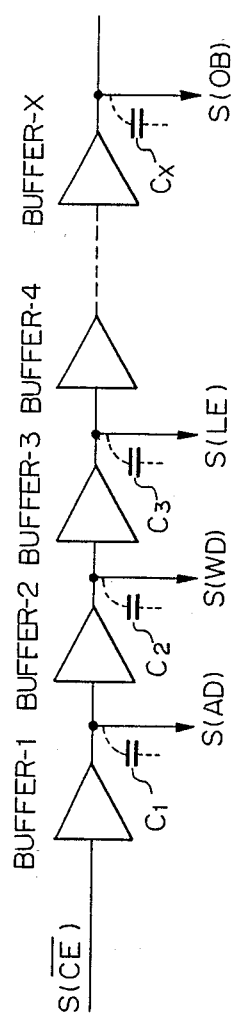
FIG. 2 shows the structure of the clock generator in the device of FIG. 1.

The device of FIG. 1 is constructed by a No. 1 memory cell block 11. No. 2 memory cell block 12, word drivers 411, 412, row decoders 421, 422, sense amplifier and input/output circuits 21, 22, column decoders 31, 32, clock generation portion 6 having an address drive generator 6A, block selector 6B, clock generator 6C, write clock generator 7, data input buffer 81, and data output buffer 82.

The clock generation portion 6 receives a chip activation signal $S(\overline{CE})$, and a clock signal S(AD) from the clock generation portion 6 is supplied to the address buffer 52. The external address bits $A_0, A_1, A_2, \ldots A_n$ are latched in the address buffer 52. In the address buffer 52, the MOS level address bits $a_0, a_1, a_2, \ldots a_n$ and the inverted MOS level address bits $\overline{a_0}, \overline{a_1}, \overline{a_2}, \ldots \overline{a_n}$ are produced from the external address bits $A_0, A_1, A_2 \ldots A_n$, and the produced signals are supplied to the column decoders 31, 32 and the row decoders 421, 422.

The clock signal S(WD) for activating word lines from the clock generation portion 6 is supplied to the word drivers 411 and 412. The clock signal S(LE) for resetting bit lines from the clock generation portion 6 is supplied to the sense amplifier and input/output circuits 21 and 22, to precharge the bit lines.

The clock signal S(CD) for activating bit lines from the clock generation portion 6 is supplied to the column decoders 31 and 32. The write clock generator 7 supplies the write clock signal S(7) to the data input buffer 81 in response to the write enable signal S(WE). The input data D(IN) in the data input buffer 81 is supplied to the sense amplifier and input/output circuits 21 and 22 in accordance with the write clock signal S(7).

The clock generator 6C includes a sequence of buffers: BUFFER-1, BUFFER-2, BUFFER-3, ... BUFFER-X. Each of the buffers produces a predetermined clock signal such as S(AD), S(WD), S(LE), S(OB) or the like with a predetermined delay time.

Figure 5:
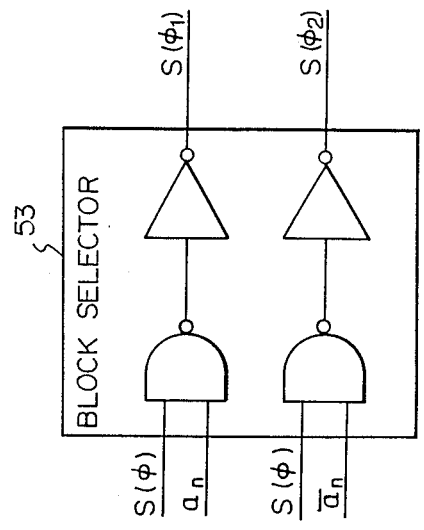
FIG. 5 shows the structure of the block selector in the device of FIG. 3.
Figure 3A:
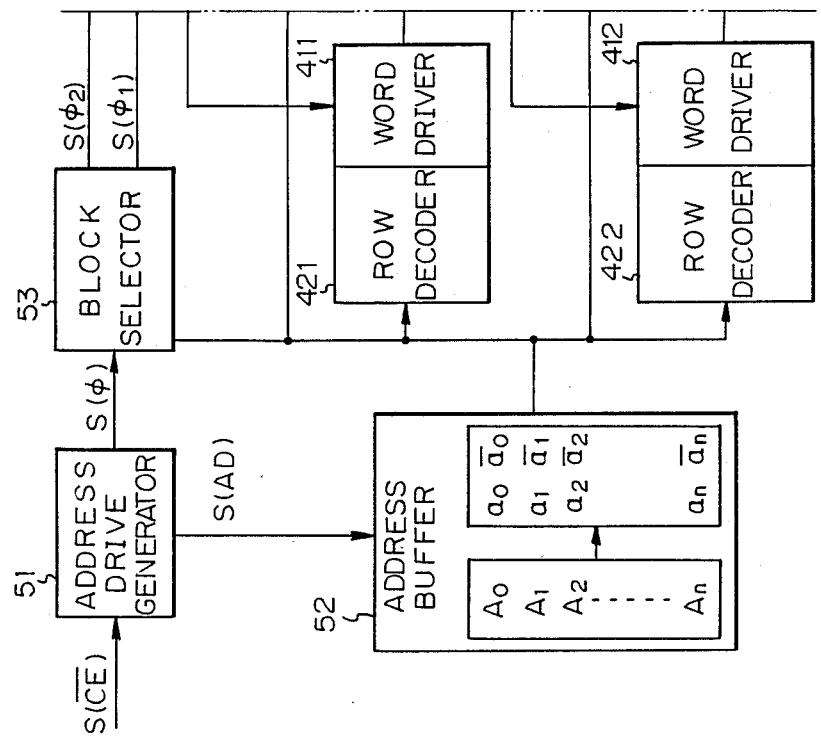
FIGS. 3a and b show a semiconductor memory device according to an embodiment of the present invention.
Figure 4:
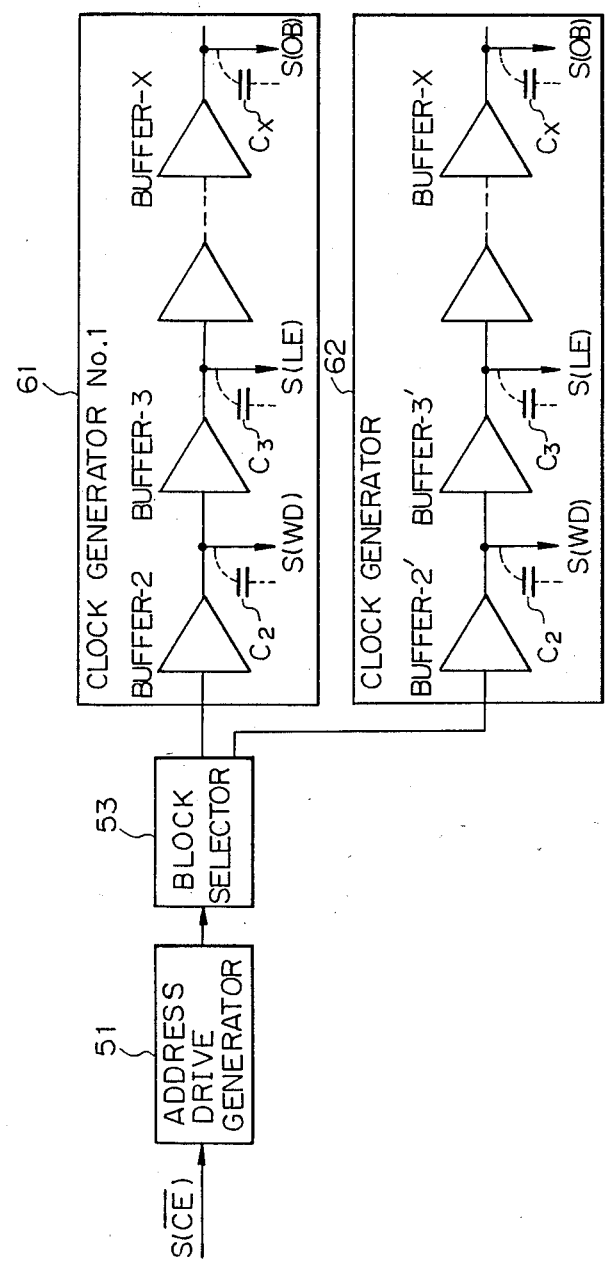
FIG. 4 shows the structure of the clock generator in the device of FIG. 3.

A semiconductor memory device according to an embodiment of the present invention is shown in FIG. 3. The structures of the clock selector and the block selector in the device of FIG. 3 are shown in FIGS. 4 and 5, respectively.

The semiconductor memory device of FIG. 3 is constructed from a No. 1 memory cell block 11, No. 2 memory cell block 12, word drivers 411, 412, row decoders 421, 422, sense amplifier and input/output circuits 21, 22, column decoders 31, 32, address drive generator 51, address buffer 52, block selector 53, No. 1 clock generator 61, No. 2 clock generator 62, write clock generator 7, data input buffer 81, and data output buffer 82.

The address drive generator 51 receives the chip activation signal S($\overline{CE}$), and the clock signal S(AD) from the address generator 51 is supplied to the address buffer 52. The external addresses bits $A_0, A_1, A_2 \ldots A_n$ are latched in the address buffer 52. In the address buffer 52, the MOS level address bits $a_0, a_1, a_2, \ldots a_n$ and the inverted MOS level address bits $\overline{a_0}, \overline{a_1}, \overline{a_2}, \ldots \overline{a_n}$ are produced from the external address bits $A_0, A_1, A_2, \ldots A_n$, and the produced signals are supplied to the column decoders 31, 32, and the row decoders 421, 422.

The clock signals S(WD) for activating word lines from the No. 1 clock generator 61 and the No. 2 clock generator 62 are supplied to the word drivers 411 and 412.

The clock signals S(LE) for resetting bit lines from the clock generators 61 and 62 are supplied to the sense amplifier and input/output circuits 21 and 22 to precharge the bit lines.

The clock signals S(CD) for activating bit lines from the clock generators 61 and 62 are supplied to the column decoders 31 and 32.

The write clock generator 7 supplies the write clock signal S(7) to the data input buffer 81 in response to the write enable signal S(WE). The input data D(IN) in the data input buffer 81 is supplied to the sense amplifier and input/output circuits 21 and 22 in accordance with the write clock signal S(7).

The block selector 53 receives the signal representing a portion of the row address, for example, the uppermost bit of the row address, delivered from the address buffer 52, and selects either the No. 1 clock generator 61 by signal S($\phi_1$) or the No. 2 clock generator 62 by signal S($\phi_2$) in correspondence with the information of the portion of the row address.

The No. 1 clock generator 61 produces the word line activation clock signal S(WD), the bit line resetting clock signal S(LE), and the bit line activation clock signal S(CD) for the No. 1 cell block 11. The No. 2 clock generator 62 produces the same signals as in the case of the No. 1 clock generator 61 for the No. 2 cell block 12.

The address drive generator 51 receives the chip activation signal S($\overline{CE}$) and delivers the clock signal S(AD).

In the operation of the device of FIG. 3, both the row decoders 412 and 422 are activated. However, only one of the word drivers 411 and 412 is activated in accordance with the selection between the No. 1 clock generator 61 and the No. 2 clock generator 62.

The structure of the No. 1 and No. 2 clock generators is shown in FIG. 4, and the structure of the block selector 53 is shown in FIG. 5.

As shown in FIG. 4, the No. 1 clock generator 61 includes the series connected buffers: BUFFER-2, BUFFER-3, BUFFER-4, and so on. Each of these buffers operates with a predetermined delay time. The No. 2 clock generator 62 includes similar series connected buffers.

As shown in FIG. 5, the block selector 53 is constructed from a series connection of a NAND gate and an inverter. One input terminal of the NAND gate receives the signal S($\phi$) from the address drive generator, while the other input terminal receives address bits $a_n$ and $\overline{a_n}$ from the address buffer 52. The address bits $a_n$ and $\overline{a_n}$ are the MOS level address bits converted from the external address $A_n$. When $A_n$ is at a HIGH level, $a_n$ is at a HIGH level, and $\overline{a_n}$ is at a LOW level. The selection signal S($\phi_1$) or S($\phi_2$) is delivered from one of the inverters of the block selector 53.

Figure 6:
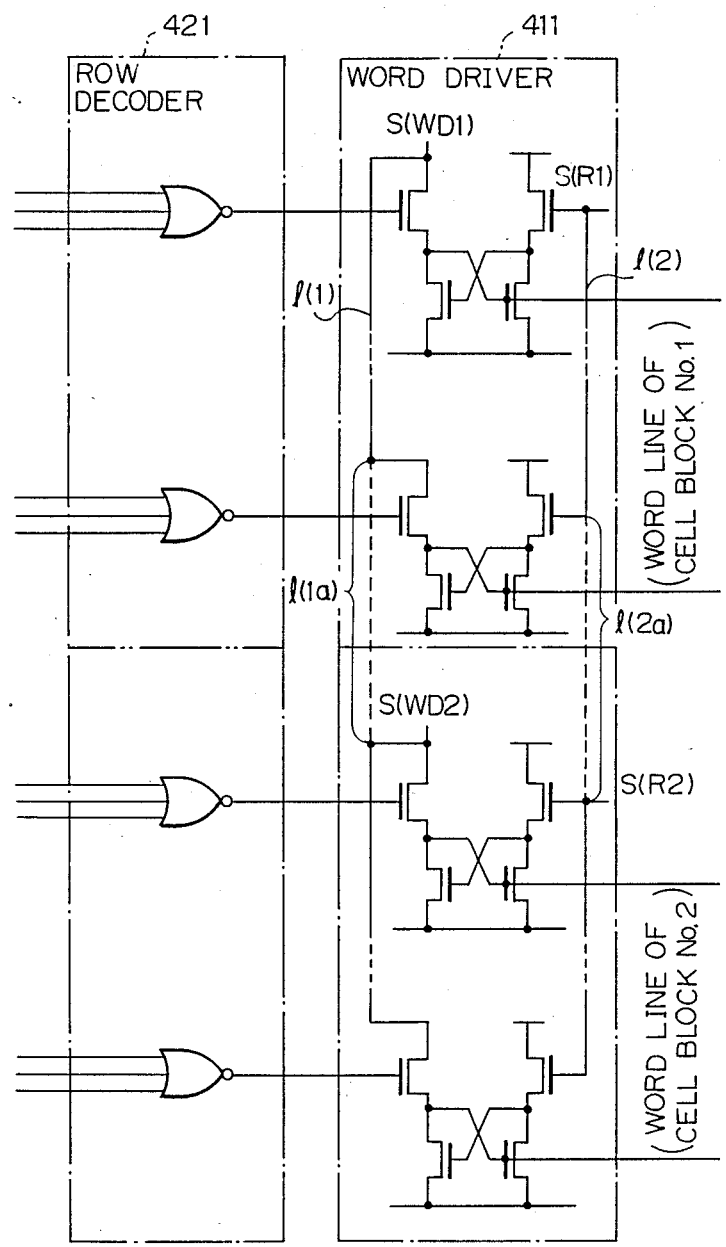
FIG. 6 shows the structures of the row decoder and word driver in the device of FIG. 3.

The characteristic of the capacitance distribution in the word driver 411 in the device of FIG. 3 will be explained with reference to FIG. 6, which shows the structures of the row decoder 421 and the word driver 411 in the device of FIG. 3. The word driver 411 is constructed from flip-flop circuits.

The signal S(WD1) and the signal S(WD2) are supplied as a power source voltage to one branch of the flip-flop circuits. The outputs of the row decoder 421 are supplied to the gates of the transistors in the one branch of the flip-flop circuits. The reset clock signals S(R1) and S(R2) are supplied to the gates of the transistors in the other branch of the flip-flop circuits.

In the word driver 411 of the device of FIG. 3, the portions l(1a) and l(2a) of the wirings l(1) and l(2) do not exist. Since there are no wirings of the portions l(1a) and l(2a), the parasitic capacitance of the entire wiring is reduced accordingly. Therefore, the entire parasitic capacitance of the wirings is reduced in the device of FIG. 3. Accordingly, the operation speed of the device is enhanced and the consumption of electric power is reduced in the device of FIG. 3.

Contrary to this, if the portions l(1a) and l(2a) exist as in the case of the prior art device, a considerably large parasitic capacitance of the wiring is formed, and this formed parasitic capacitance is added to the drain capacitances of the transistors of the flip-flop circuits in the word driver. This large capacitance requires a considerably large capacity of the power source, and constitutes a disadvantage of the prior art.

In the device of FIG. 3, the parasitic capacitances of the wirings for transmitting the signals S(WD), S(LE), and the like from the clock generators 61 and 62 (FIG. 4) are reduced, and thus the charge/discharge current is reduced, and the time of charge/discharge is reduced. Also, the capacity requirement for the buffers: BUFFER-2, BUFFER-3, etc., is reduced. Only one of the clock generators is required to operate so that the consumption of electric power is reduced.

Although a typical embodiment of the present invention is explained with reference to FIGS. 3 to 6 in which the division by 2 of the cell blocks is realized, other embodiments of the present invention are possible in which the division by 4, 8, 16, or the like of the cell blocks is realized.

Also, although the device of FIG. 3, the division is realized only in the row decoder side, it is also possible to realize the division not only in the row decoder side but also in the column decoder and input-output side. The clock generator should be divided in correspondence with such division in the column decoder and input-output circuit side.

A semiconductor memory device according to a modified embodiment of the present invention is shown in FIG. 7. The column decoder 30 is provided commonly for the No. 1 cell block 11 and the No. 2 cell block 12.

In the address buffer 52, the sequence of the non-inverted bit and the inverted bit $a_0$, $\overline{a_0}$; $a_1$, $\overline{a_1}$; ... $a_n$, $\overline{a_n}$ is produced from the external address $EA_0$, $EA_1$, ... $EA_n$, and the uppermost bit $a_i$, $\overline{a_i}$ among the above-mentioned sequence is supplied to the block selector 53.

The clock signal $S(\phi_1)$ from the block selector 53 is supplied to the No. 1 clock generator 61, the clock signal $S(\phi_2)$ from the block selector 53 is supplied to the No. 2 clock generator 62, and the clock signal S(WD1) from the No. 1 clock generator 61 is supplied to the word driver 411. The clock signal S(WD2) from the No. 2 clock generator 62 is supplied to the word driver 412.

Figure 8A:
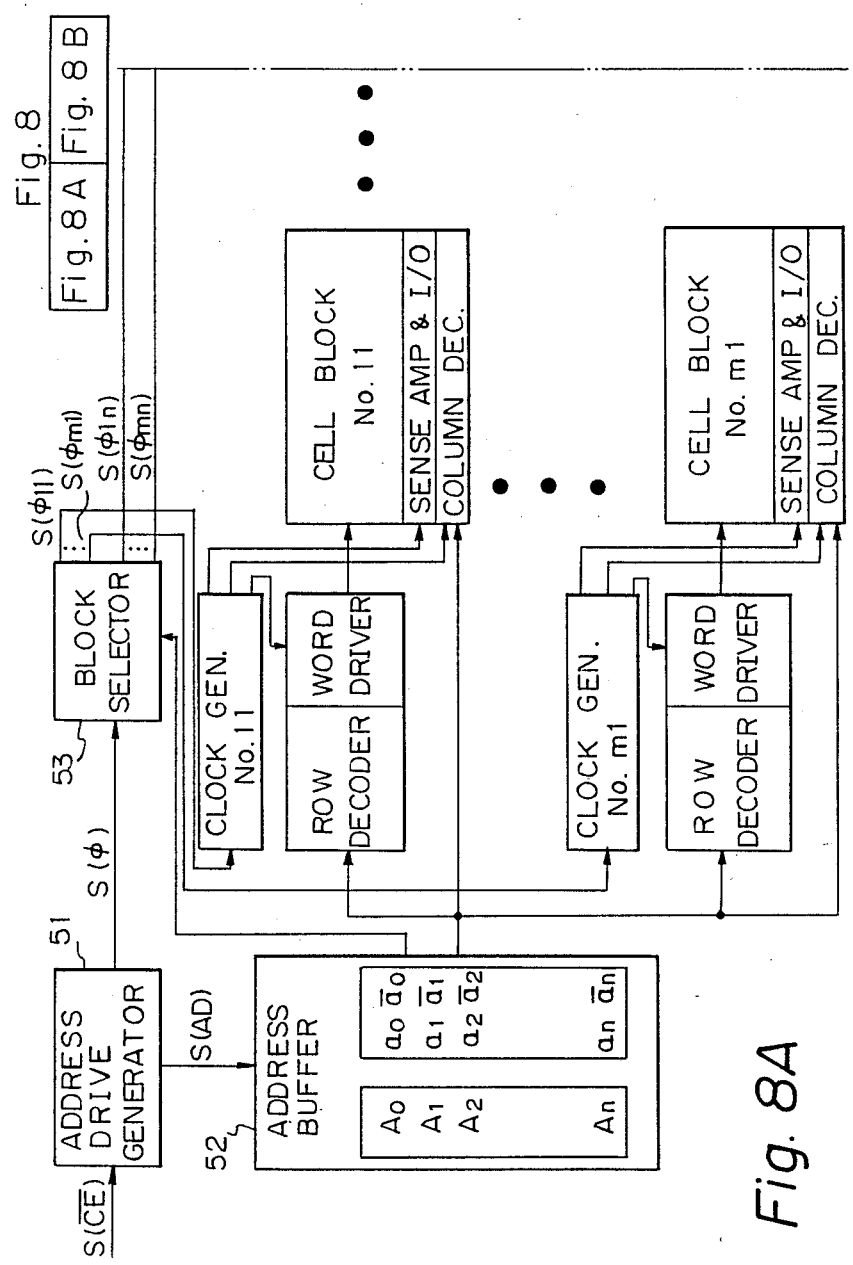
FIGS. 8a and b show another modified embodiment of the present invention.

A semiconductor memory device according to another modified embodiment of the present invention is shown in FIG. 8. In the device of FIG. 8, the memory cell block is divided into m divisions along the row direction and n divisions along the column direction, to consequently attain m×n divisions.

The block selector 53 delivers the clock signals $S(\phi_{11})$, $S(\phi_{21})$, ... $S(\phi_{m1})$; $S(\phi_{12})$, $S(\phi_{22})$, ... $S(\phi_{m2})$; ... $S(\phi_{1n})$, $S(\phi_{2n})$, ... $S(\phi_{mn})$ which are supplied to the clock generators No. 11, No. 21, ... No. m1; No. 12, No. 22, ... No. m2; ... ; No. 1n, No. 2n, ... No. mn. For example, the No. 11 clock generator delivers the signals for the No. 11 cell block, and the No. mn clock generator delivers the signal for the No. mn cell block.

We claim:

1. A semiconductor memory device including row decoders and column decoders, comprising:
   a memory cell array including a plurality of memory cell blocks, each of said memory cell blocks being respectively operatively connected to one of the row decoders and one of the column decoders;
   clock generator means including a plurality of clock generator sections, each of said clock generator sections corresponding to one of said memory cell blocks and each of said clock generator sections sequentially generating a plurality of clock signals for driving corresponding memory cell blocks;
   address drive generator means for generating an address drive signal;
   address buffer means, coupled to said address drive generator means, for receiving the address drive signal and outputting address bit signals; and
   block selector means, coupled to said clock generator means, for selecting one of said clock generator sections in correspondence with the row address of a designated address and causing clock signals of only said selected clock generator section to be output for operating a corresponding one of said memory cell blocks, said block selector means comprising:
   a plurality of two-input logic gates having first input terminals for receiving address drive signals from said address drive generator, means, and second input terminals for receiving address bit signals from said address buffer,
   whereby only a clock generator section corresponding to said selected memory cell block is operated by said designated address.

2. A semiconductor memory device according to claim 1, further comprising a block selector connected to said clock generator means, wherein each of said clock generator sections receives a signal from said block selector.

3. A semiconductor memory device according to claim 1, further comprising:
   word drivers coupled to said respective memory cell blocks; and
   circuits including a sense amplifier and an input/output circuit;
   wherein each of said clock generator sections comprises series connected buffers operating with predetermined time delays for delivering signals to said respective word drivers and to said respective circuits including said sense amplifier and said input/output circuit.

4. A semiconductor memory device according to claim 1, wherein said plurality of two input logic gates include a plurality of NAND gates.

5. A semiconductor device according to claim 4, wherein said block selector means further comprises a plurality of inverters respectively connected in series with said NAND gates.

* * * * *